US010229768B2

United States Patent
Yoon

(10) Patent No.: US 10,229,768 B2
(45) Date of Patent: Mar. 12, 2019

(54) METHOD FOR MANUFACTURING GRAPHENE LAYER

(71) Applicant: HANWHA AEROSPACE CO., LTD., Changwon-si (KR)

(72) Inventor: Jong-hyuk Yoon, Changwon (KR)

(73) Assignee: HANWHA AEROSPACE CO., LTD., Changwon-si (KR)

(*) Notice: Subject to any disclaimer, the term of this patent is extended or adjusted under 35 U.S.C. 154(b) by 778 days.

(21) Appl. No.: 14/425,112

(22) PCT Filed: Nov. 26, 2012

(86) PCT No.: PCT/KR2012/010008
§ 371 (c)(1),
(2) Date: Mar. 2, 2015

(87) PCT Pub. No.: WO2014/038752
PCT Pub. Date: Mar. 13, 2014

(65) Prior Publication Data
US 2016/0189821 A1    Jun. 30, 2016

(30) Foreign Application Priority Data
Sep. 6, 2012  (KR) .................. 10-2012-0098957

(51) Int. Cl.
*H01B 1/00*    (2006.01)
*C01B 32/00*   (2017.01)
(Continued)

(52) U.S. Cl.
CPC .............. *H01B 1/04* (2013.01); *B32B 37/025* (2013.01); *B32B 37/20* (2013.01); *B32B 38/10* (2013.01);
(Continued)

(58) Field of Classification Search
CPC .......... H01B 1/00; C01B 32/00; C01B 32/10; C01B 32/19; C01B 32/19; C01B 32/194;
(Continued)

(56) References Cited

U.S. PATENT DOCUMENTS

| 7,766,033 B2 | 8/2010 | Mathies et al. |
| 2004/0101685 A1* | 5/2004 | Fan ............... B82Y 10/00 428/403 |

(Continued)

FOREIGN PATENT DOCUMENTS

| JP | 2004-33919 A | 2/2004 |
| JP | 2010-8145 A | 1/2010 |

(Continued)

OTHER PUBLICATIONS

Written Opinion dated Mar. 12, 2013 issued by the International Searching Authority in counterpart International Patent Application No. PCT/KR2012/010008 (PCT/ISA/237).

(Continued)

*Primary Examiner* — Jacob T Minskey
*Assistant Examiner* — Matthew Hoover
(74) *Attorney, Agent, or Firm* — Sughrue Mion, PLLC

(57) ABSTRACT

A method of manufacturing graphene, the method including: preparing a carrier member on which the graphene is formed on one surface thereof; exposing the graphene to dopant vapor to dope the graphene; transferring the doped graphene onto a target member; and removing the carrier member.

18 Claims, 4 Drawing Sheets

(51) Int. Cl.
  *B32B 37/00* (2006.01)
  *B32B 38/00* (2006.01)
  *B82Y 30/00* (2011.01)
  *B82Y 40/00* (2011.01)
  *C30B 29/00* (2006.01)
  *C30B 31/00* (2006.01)
  *H01B 1/04* (2006.01)
  *C30B 29/02* (2006.01)
  *C30B 31/06* (2006.01)
  *B32B 37/20* (2006.01)
  *B32B 38/10* (2006.01)
  *C01B 32/186* (2017.01)
  *C01B 32/194* (2017.01)

(52) U.S. Cl.
  CPC .............. *B82Y 30/00* (2013.01); *B82Y 40/00* (2013.01); *C01B 32/186* (2017.08); *C01B 32/194* (2017.08); *C30B 29/02* (2013.01); *C30B 31/06* (2013.01); *B32B 2313/04* (2013.01); *B32B 2457/20* (2013.01)

(58) Field of Classification Search
  CPC ....... C01B 32/18; C01B 32/18; C01B 32/186; B32B 37/00; B32B 37/02; B32B 37/02; B32B 37/025; B32B 37/20; B32B 38/00; B32B 38/10; B82Y 30/00; B82Y 40/00; C30B 29/00; C30B 29/02; C30B 31/00; C30B 31/06

See application file for complete search history.

(56) References Cited

U.S. PATENT DOCUMENTS

| | | | |
|---|---|---|---|
| 2010/0240199 A1 | 9/2010 | Zhou et al. | |
| 2011/0030879 A1* | 2/2011 | Veerasamy | B82Y 30/00 156/99 |
| 2011/0048625 A1 | 3/2011 | Caldwell et al. | |
| 2012/0270054 A1* | 10/2012 | Hong | B29B 15/08 428/408 |

FOREIGN PATENT DOCUMENTS

| | | | | |
|---|---|---|---|---|
| JP | 2010-281645 A | | 12/2010 | |
| JP | 2011-117805 A | | 6/2011 | |
| KR | 20110079532 A | * | 7/2011 | ............ B29B 15/08 |
| WO | 2011/063082 A2 | | 5/2011 | |
| WO | 2011/081440 A2 | | 7/2011 | |

OTHER PUBLICATIONS

Search Report dated Mar. 12, 2013 issued by the International Searching Authority in counterpart International Patent Application No. PCT/KR2012/010008 (PCT/ISA/210).

* cited by examiner

[Fig. 1]
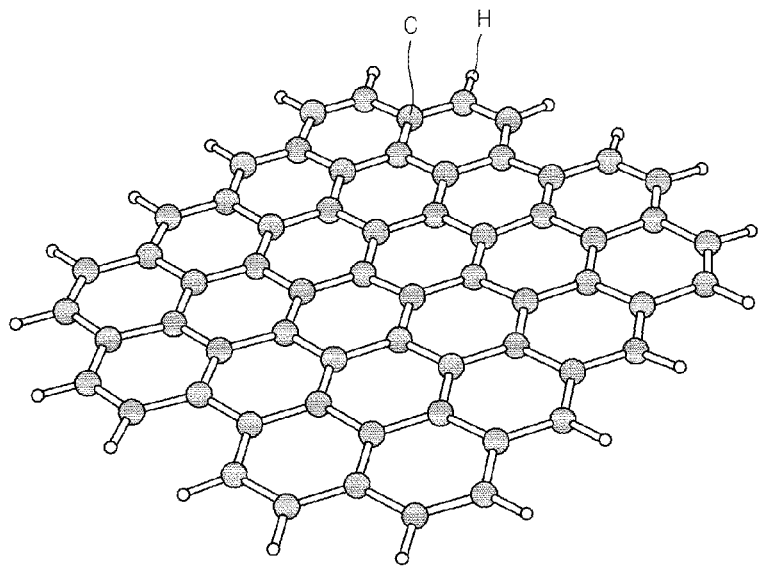
[Fig. 2]
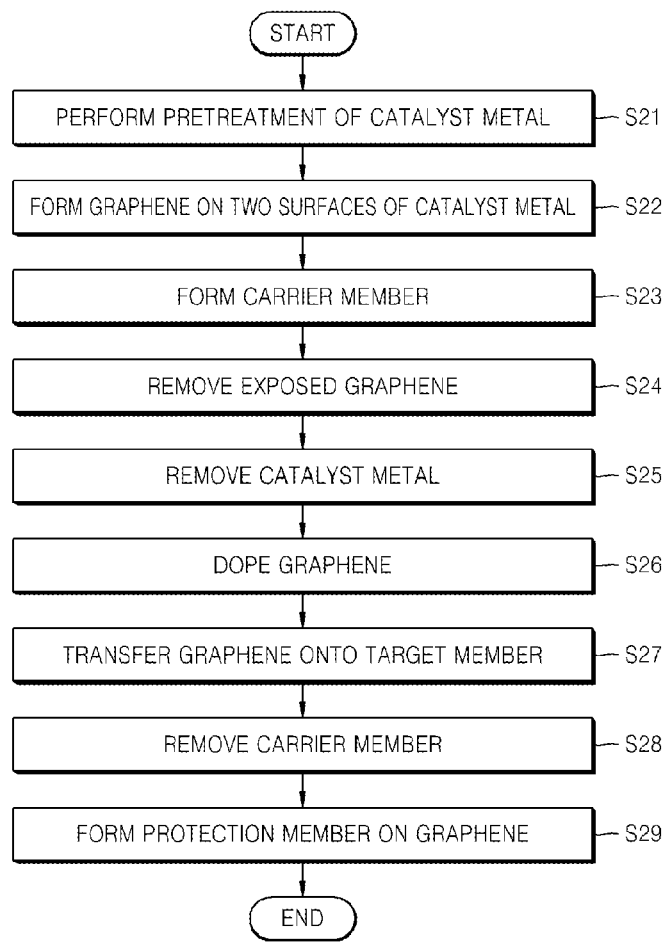

[Fig. 3]
[Fig. 4]
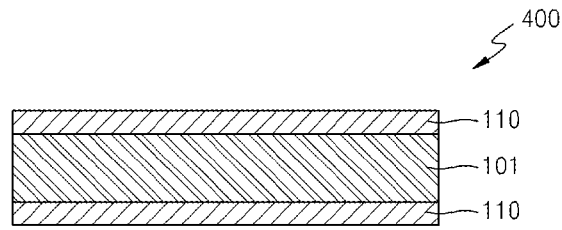
[Fig. 5]
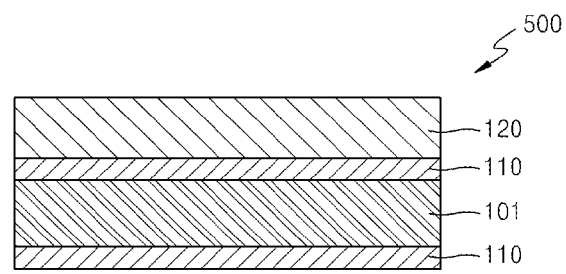
[Fig. 6]
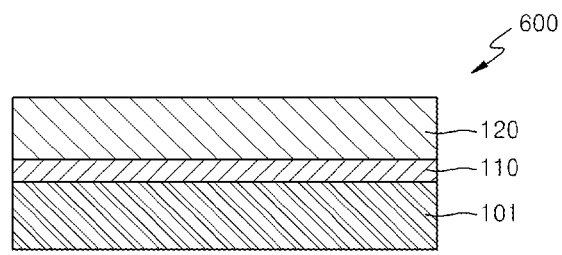
[Fig. 7]
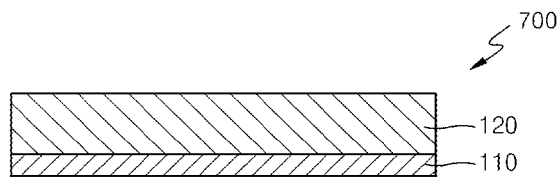
[Fig. 8]
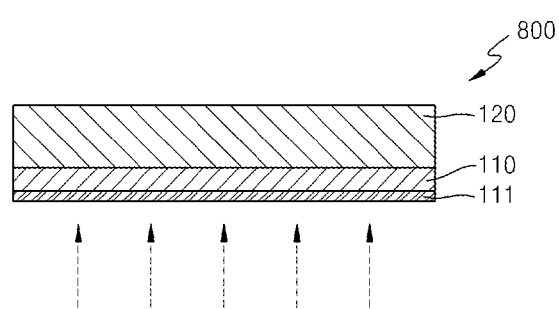

[Fig. 9]
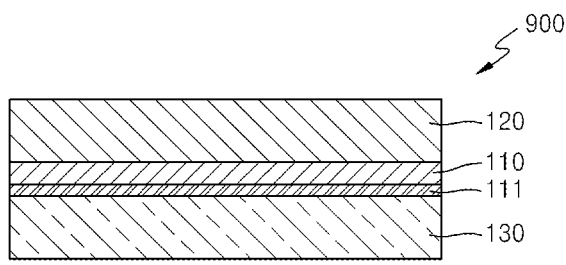
[Fig. 10]
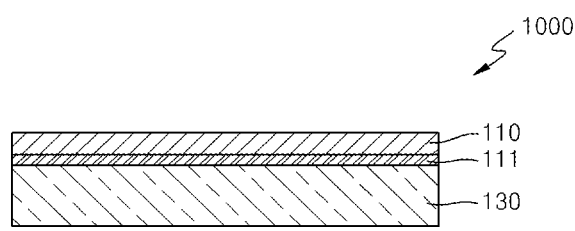
[Fig. 11]
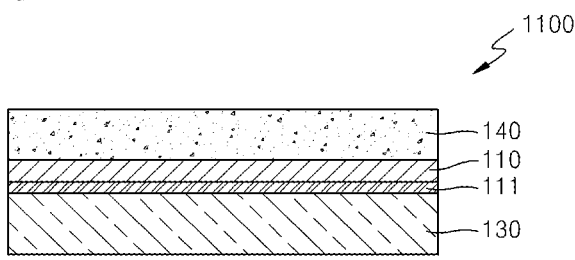

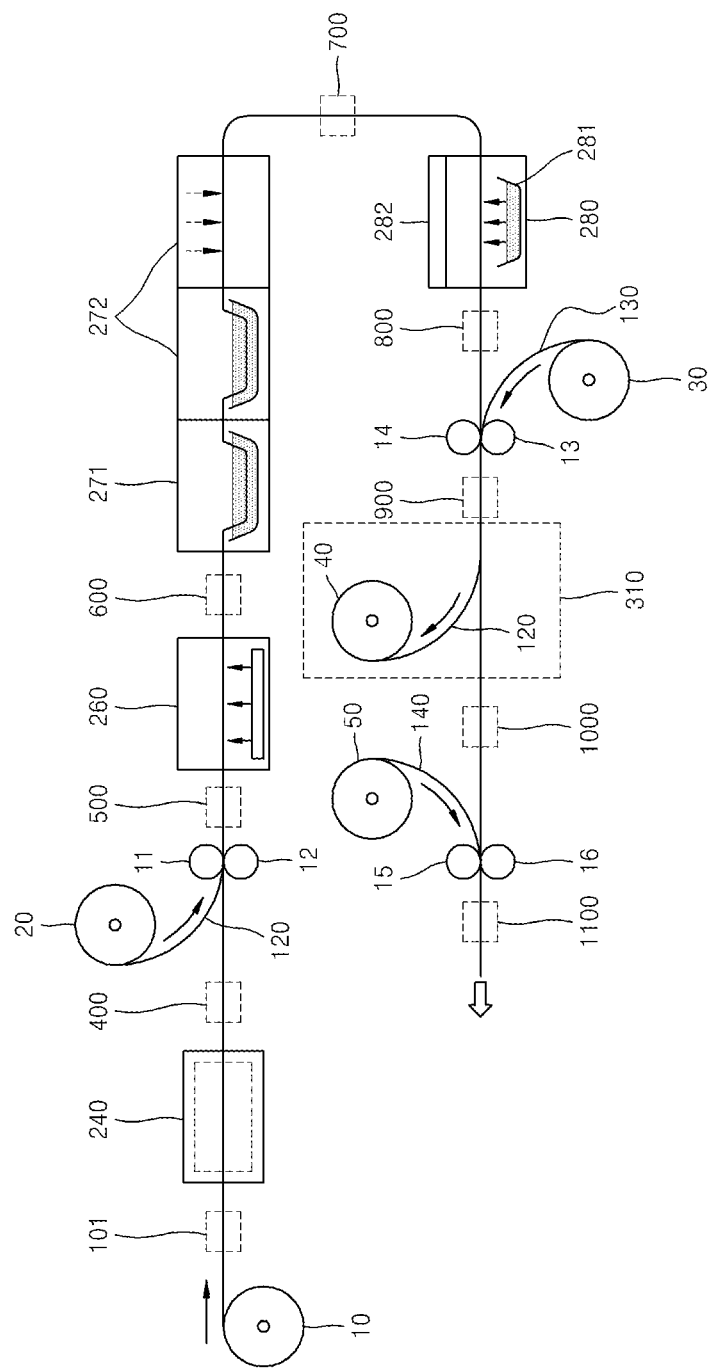
[Fig. 12]

METHOD FOR MANUFACTURING GRAPHENE LAYER

TECHNICAL FIELD

The present invention relates to a method of manufacturing graphene, and more particularly, to a method of manufacturing graphene including an operation for doping graphene.

BACKGROUND ART

Graphene is a material that has a honeycomb-shaped two-dimensional (2D) planar structure in which a plurality of carbon atoms are coupled to one another in a hexagonal form. Graphene is extremely thin and transparent and has an extremely high electrical conductivity. Recently, many attempts have been made to use graphene in touch panels, transparent display devices, flexible display devices, etc. by using graphene having the aforementioned characteristics. As much attention about graphene increases, a need for a method for producing high quality graphene in large quantities increases.

DISCLOSURE OF INVENTION

Technical Problem

Recently, research into a method of manufacturing large-scaled and high quality graphene has been actively conducted. In order to commercialize such large-scaled and high quality graphene, graphene needs to have a low surface resistance. Thus, in order to reduce the surface resistance of graphene, an operation for doping the graphene is performed. However, in a conventional doping method disclosed in Korean Patent Publication No. 2011-0061909, a doping effect of graphene is not maintained enough to commercialize the graphene, and it is also difficult to uniformly dope large-scaled graphene.

Solution to Problem

According to an aspect of the present invention, there is provided a method of manufacturing graphene with an improved electrical characteristic.

According to another aspect of the present invention, there is provided a method of manufacturing graphene, the method including preparing a carrier member on which graphene is formed on one surface thereof; exposing the graphene to dopant vapor to dope the graphene; transferring the doped graphene onto a target member; and removing the carrier member.

Advantageous Effects of Invention

According to one or more embodiments of the present invention, a doping effect of graphene may be maintained for a long time, compared to a conventional method of manufacturing graphene, and even large-scaled graphene may be uniformly doped. Also, since the graphene manufacturing process including a graphene synthesis operation, an etching operation, a releasing operation, and a transfer operation is performed in one direction according to a roll-to-roll method, graphene may be manufactured in large quantities.

BRIEF DESCRIPTION OF DRAWINGS

FIG. 1 is a schematic perspective view of graphene according to an embodiment of the present invention;

FIG. 2 is a schematic flowchart for describing a method of manufacturing the graphene shown in FIG. 1, according to an embodiment of the present invention;

FIGS. 3 through 11 are schematic cross-sectional side views of a stack including the graphene of FIG. 2; and FIG. 12 is a schematic process view for describing a method of manufacturing a graphene film, according to an embodiment of the present invention.

BEST MODE FOR CARRYING OUT THE INVENTION

According to an aspect of the present invention, there is provided a method of manufacturing graphene, the method including: preparing a carrier member on which the graphene is formed on one surface thereof; exposing the graphene to dopant vapor to dope the graphene; transferring the doped graphene onto a target member; and removing the carrier member.

The preparing of the carrier member on which the graphene is formed on one surface thereof may include: forming the graphene on two surfaces of a catalyst metal; forming the carrier member on the graphene that is formed on one surface of the catalyst metal; and removing the catalyst metal.

The method may further include removing the graphene formed on the other surface of the catalyst metal before the removing of the catalyst metal.

The catalyst metal may include at least one selected from the group consisting of nickel (Ni) and copper (Cu).

The catalyst metal may be removed by wet etching.

The method may further include forming a protection member on the exposed graphene after the removing of the carrier member.

The carrier member may be a heat-releasable film.

The target member may be formed of a material that is formed according to a roll-to-roll method, and the target member may include at least one selected from the group consisting of polyethylene terephthalate (PET), polyimide (PI), polycarbonate, and polymethyl methacrylate (PMMA).

The dopant vapor may be composed of a volatile doping solution that is vaporized.

The doping solution may include at least one selected from the group consisting of gold(III) chloride ($AuCl_3$), nitric acid ($HNO_3$), and hydrochloric acid (HCl).

In the dopant vapor, some dopant vapor that is not doped on the graphene may be liquefied by using a cooler to thus become the doping solution.

The doping of the graphene may be performed in a sealed space.

According to another aspect of the present invention, there is provided a method of manufacturing a graphene film, the method including: preparing a roll-type heat-releasable film in which the graphene film is formed on one surface thereof; exposing the graphene film to dopant vapor to dope the graphene film; transferring the doped graphene film onto a roll-type target film; and removing the heat-releasable film, wherein the operations are performed in one direction according to a roll-to-roll method.

The preparing of the heat-releasable film in which the graphene film is formed on one surface thereof may include: forming the graphene film on two surfaces of a roll-type catalyst metal film; forming the heat-releasable film on the graphene film that is formed on one surface of the catalyst metal film; removing the graphene film formed on the other surface of the catalyst metal film; and removing the catalyst metal film, wherein the operations are performed in one direction according to a roll-to-roll method.

The method may further include forming a roll-type protection film on the exposed graphene film after the removing of the heat-releasable film, wherein the forming of the roll-type protection film is performed in one direction according to a roll-to-roll method.

The dopant vapor may be composed of a volatile doping solution that is vaporized by using a vaporizer.

The doping solution may include at least one selected from the group consisting of gold(III) chloride (AuCl3) nitric acid (HNO3), and hydrochloric acid (HCl).

In the dopant vapor, some dopant vapor that is not doped on the graphene film may be liquefied by using a cooler to thus become the doping solution.

The doping of the graphene film may be performed in a sealed space.

MODE FOR THE INVENTION

Various changes in form and details may be made to the present inventive concept and thus should not be construed as being limited to the embodiments set forth herein. The inventive concept is not limited to the embodiments described in the present description, and thus it should be understood that the inventive concept does not include every kind of variation example or alternative equivalent included in the spirit and scope of the inventive concept. Also, while describing the embodiments, detailed descriptions about related well-known functions or configurations that may diminish the clarity of the points of the embodiments of the present invention will be omitted.

In the present description, terms such as 'first', 'second', etc. are used to describe various elements. However, it is obvious that the elements should not be defined by these terms. The terms are used only for distinguishing one element from another element.

Throughout the specification, it will also be understood that when an element such as layer, region, or substrate is referred to as being "on" another element, it can be directly on the other element, or intervening elements may also be present.

Hereinafter, the present invention will be described in detail by explaining exemplary embodiments of the invention with reference to the attached drawings. Like reference numerals in the drawings denote like elements, and thus their description will be omitted. In the drawings, like reference numerals denote like elements, and the sizes and thicknesses of elements may be exaggerated for clarity.

FIG. 1 is a schematic perspective view of graphene according to an embodiment of the present invention.

The term 'graphene' used in the specification refers to graphene formed to have a film shape in which a plurality of carbon atoms are coupled to one another by a covalent bond to form a polycyclic aromatic molecule. Although the carbon atoms coupled to one another by a covalent bond form a 6-membered ring as a basic repeating unit, the graphene may further include a 5-membered ring and/or 7-membered ring. Accordingly, the graphene forms a single layer of the carbon atoms coupled to one another (in general, sp2 bonding) by a covalent bond. The graphene may have any of various structures which may vary according to a 5-membered ring and/or a 7-membered ring that may be included in the graphene.

Although the graphene may be configured as a single layer as shown in FIG. 1, a plurality of graphene layers may be stacked on each other to be configured as multi-layer graphene. Also, a side end portion of the graphene may be generally saturated with hydrogen atoms.

FIG. 2 is a schematic flowchart for describing a method of manufacturing the graphene according to an embodiment of the present invention. FIGS. 3 through 11 are schematic cross-sectional side views of a stack including the graphene of FIG. 2.

The term 'stack' used in the specification refers to a plurality of layers including graphene. The stack may include at least one layer among a catalyst metal, a carrier member, a target member, and a protecting member in addition to a graphene film, according to a method of manufacturing graphene.

First, pretreatment of a catalyst metal 101 is performed (operation S21).

The catalyst metal 101 is a catalyst for growing a graphene 110 and may be configured as a sheet-, substrate-, or film-type catalyst metal. The catalyst metal 101 may include at least one metal among nickel (Ni), cobalt (Co), iron (Fe), platinum (Pt), gold (Au), silver (Ag), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), palladium (Pd), yttrium (Y), zirconium (Zr), germanium (Ge), brass, bronze, white brass, and stainless steel, or an alloy thereof, but the present invention is not limited thereto.

The catalyst metal 101 may be configured as a single layer, or may be one of two or more layers constituting a multi-layer structure. In this case, the catalyst metal 101 is disposed at an outermost side of the multi-layer.

A pretreatment process for washing a surface of the catalyst metal 101 is performed before forming the graphene 110. This pretreatment process is performed to remove foreign substances on the surface of the catalyst metal 101, and a hydrogen gas may be used for the pretreatment process. Also, the surface of the catalyst metal 101 may be washed by using an acid or alkali solution so as to reduce defects of the graphene 110 when forming the graphene 110 in a later process. The operation for washing the surface of the catalyst metal 101 may be omitted if necessary.

Next, an operation for forming the graphene 110 will be described with reference to FIG. 4 (operation S22).

If the catalyst metal 101 is transferred to a reaction chamber (not shown), a gaseous source of carbon is injected into the reaction chamber, and then a thermal treatment is performed thereon. The thermal treatment includes heating and cooling operations. In the operation for forming the graphene 110, various methods such as chemical vapor deposition (CVD), thermal chemical vapor deposition (TCVD), rapid thermal chemical vapor deposition (RTCVD), inductively coupled plasma chemical vapor deposition (ICP-CVD), or atomic layer deposition (ALD) may be used.

The gaseous source of carbon may use at least one selected from the group consisting of carbon atoms such as methane (CH4), carbon monoxide (CO), ethane (C2H6), ethylene (CH2), ethanol (C2H5), acetylene (C2H2), propane (CH3CH2CH3), propylene (C3H6), butane (C4H10), pentane (CH3(CH23CH3), pentene (C5H10), cyclopentadiene (C5H6), hexane (C6H14), cyclohexane (C6H12), benzene (C6H6), and toluene (C7H8). Thus, the gaseous source of carbon is divided into carbon atoms and hydrogen atoms at a high temperature. The carbon atoms are deposited on the heated catalyst metal 101, and then the catalyst metal 101 is cooled, thereby forming the graphene 110.

The graphene 110 may be formed on at least one surface of the catalyst metal 101. Although the graphene 110 may be formed on two surfaces of the catalyst metal 101 as shown in FIG. 4, the present invention is not limited thereto. Thus, the graphene 110 may be formed on only one surface of the catalyst metal 101.

Next, an operation for forming a carrier member 120 on the graphene 110 will be described with reference to FIG. 5 (operation S23).

The carrier member 120 supports a fourth stack 400 (see FIG. 4) to facilitate transfer of the fourth stack 400. The carrier member 120 may also maintain the shape of the graphene 110 and prevent damage to the graphene 110. The carrier member 120 may be formed as a sheet-, substrate-, or film-type carrier member.

According to an embodiment of the present invention, the carrier member 120 may be a heat-releasable film. Although one surface of the heat-releasable film has an adhesive property at room temperature, if the heat-releasable film is heated over a predetermined release temperature, the one surface of the heat-releasable film loses the adhesive property, and thus the carrier member 120 may be selected from products having various release temperatures.

However, the carrier member 120 according to an embodiment of the present invention is not limited to a heat-releasable film, and may be a polymer support. Here, the polymer support may include an organic polymer, such as polymethyl methacrylate (PMMA). The polymer support may be formed by drop-coating the organic polymer in a liquid phase on one surface of a graphene sheet and hardening the organic polymer, and then the organic polymer may be removed by using an organic solvent.

Next, an operation for removing the graphene 110 exposed in a fifth stack 500 (see FIG. 5) will be described with reference to FIG. 6 (operation S24).

Among the graphene 110 formed on the two surfaces of the catalyst metal 101, the graphene 110 formed on one surface of the catalyst metal 101 is covered by the carrier member 120, and the graphene 110 formed on the other surface of the catalyst metal 101 is exposed to the outside. By removing the exposed graphene 110, an operation for removing the catalyst metal 101 may be easily performed in a later process. The operation for removing the graphene 110 may be performed by dry etching using physical polishing, reactive ion etching (RIE), oxygen (O2) plasma, or the like to the extent that the graphene 110 is not damaged. However, the present invention is not limited thereto, and alternatively, wet etching may be used.

Next, an operation for removing the catalyst metal 101 of a sixth stack 600 (see FIG. 6) will be described with reference to FIG. 7 (S25).

Referring to FIG. 7, a seventh stack 700, in which the graphene 110 and the carrier member 120 are stacked, is formed by performing the operation for removing the catalyst metal 101. The operation for removing the catalyst metal 101 may use wet etching using a catalyst metal removing solution. However, the present invention is not limited thereto, and dry etching for etching one surface of the catalyst metal 101 by using plasma or for polishing the one surface of the catalyst metal 101 may be added before performing the wet etching so as to reduce a time to remove the catalyst metal 101.

In the specification, the 'catalyst metal removing solution' refers to a solution used to remove the catalyst metal 101 in order to obtain the graphene 110. The catalyst metal removing solution may vary according to types of the catalyst metal 101, and representative examples of the catalyst metal removing solution may include ammonium persulfate ((NH4)2S2O8), hydrogen fluoride (HF), BOE (buffered oxide etch), iron chloride (FeCl3), iron nitrate (Fe(No3)3), copper chloride (CuCl2), peroxide (H2O2), sulfuric acid (H2SO4), sodium persulfate (Na2S2O8), and the like. However, the present invention is not limited thereto, and a peroxide-sulfuric acid-based aqueous solution which is a composite including peroxide (H2O2), sulfuric acid (H2SO4), and water (H2O) may be used as the catalyst metal removing solution.

After performing the operation for removing the catalyst metal 101, operations of washing and drying the catalyst metal removing solution remaining in the seventh stack 700 may further be performed. If the catalyst metal removing solution remains on the graphene 110, an electrical characteristic of the graphene 110 may be degraded due to impurities, when using the graphene 110 in a display transparent electrode or a solar cell, and the purity of the graphene 110 may be reduced, and thus, the operations of washing and drying the catalyst metal removing solution are necessary.

Next, an operation for doping the graphene 110 will be described with reference to FIG. 8 (operation S26).

In operation S26, doping using dopant vapor is performed to improve an electrical characteristic of the exposed graphene 110. In FIG. 8, reference numeral 111 denotes a doping material which is dopant vapor adhered to a surface of the graphene 110. The dopant vapor is obtained by vaporizing a doping solution which is highly volatile. The doping solution may use at least one among gold(III) chloride (AuCl3), nitric acid (HNO3), hydrochloric acid (HCl), copper(II) chloride (CuCl2), polyvinylidene difluoride (PVDF), and bromine (Br2). However, the present invention is not limited thereto, and the doping solution may use any one among nitronium tetrafluoroborate (NO2BF4), nitrosonium tetrafluoroborate (NOBF4), nitronium hexafluoroantimonate (NO2SbF6), dihydrogen phosphate (H2PO4), acetic acid (H3CCOOH), sulphuric acid (H2SO4), Nafion, thionyl chloride (SOCl2), and nitromethane (CH3NO2), the doping solution may use one among dichlorodicyanoquinone, oxone, dimyristoylphosphatidyl inositol, and trifluoromethanesulfonimide, or alternatively, the doping solution may use a combination of a solvent, such as distilled water, and the above-described materials.

The doping solution may be phase-changed into vapor by using a vaporizer. However, the present invention is not limited thereto, and the doping solution may be vaporized into dopant vapor without using a vaporizer according to volatility of the doping solution. Here, the vaporizer includes a heater for heating the doping solution over an evaporation point. In the doping operation according to an embodiment of the present invention, the vaporized doping solution may be liquefied to be reused.

Hereinafter, a mechanism of the doping operation for improving an electrical characteristic of the graphene 110 will be briefly described. First, resistivity may be represented by Equation 1. Here, "denotes resistivity representing an electrical characteristic of an object, and the unit of resistivity is m. "denotes conductivity. "denotes mobility, and the unit of mobility is m2/VS. 'ne' denotes n carriers (electrons or holes).

$$\rho = \frac{1}{\sigma} = \frac{1}{ne\mu} \tag{1}$$

Referring to Equation 1, in order to improve conductivity, mobility or a carrier concentration may be increased. Doping is a chemical processing for increasing the carrier concentration, and may improve the conductivity. For example, a doping principle of graphene when using AuCl3 as a dopant will now be described. If Au3+ ions, which are dissolved in a doping solution and then included in dopant vapor, are adhered to a surface of the graphene, the Au3+ ions are provided electrons from the graphene, and thus Au particles are formed on the surface of the graphene. Accordingly, the graphene loses the electrons, and thus strong p-doping occurs, thereby increasing the carrier concentration and improving the conductivity of the graphene according to Equation 1. Similarly, the graphene is p-doped even when using HNO3 or HCl as the doping solution.

During the doping, an electrical characteristic of the graphene may be adjusted by changing the type of the dopant and an exposure time of the dopant vapor. Here, the electrical characteristic may be a surface resistance and transparency of the graphene 110.

According to an embodiment of the present invention, the graphene 110 is doped by using the dopant vapor, and thus even large-scaled graphene may be easily doped. Among conventional doping methods of graphene, wet coating performs doping by transferring graphene onto a target member and then directly coating a doping solution on a surface of the graphene. In this case, it is difficult to uniformly coat a surface of large-scaled graphene with a doping solution. Also, the conventional wet coating has a problem that if the doping solution remaining on the surface of the graphene is not completely removed, stains remain on the surface of the graphene, thus reducing transparency of the graphene and degrading a quality of the graphene. However, according to an embodiment of the present invention, since doping is performed by exposing the graphene to the dopant vapor, the doping may be uniformly performed, and also stains do not remain on a surface of the graphene.

Also, since, conventionally, a method of directly coating a doping solution on graphene is used, the method wastes a doping material. However, according to an embodiment of the present invention, the dopant vapor is used, and in the dopant vapor, vapor that is not used for the doping is liquefied to be reused, and thus the doping solution is prevented from being wasted. Also, even though a small amount of doping solution is used compared a conventional method, large-scaled graphene may be doped.

Next, an operation for transferring the graphene 110 onto a target member 130 will be described with reference to FIG. 9 (operation S27).

The target member 130 refers to a member onto which the graphene 110 is transferred. The target member 130 may be configured as a sheet-, substrate-, or film-type target member. The target member 130 may include at least one among polyethylene terephthalate (PET), polyimide (PI), polydimethylsiloxane (PDMS), plastic, glass, and metal, but the present invention is not limited thereto. The target member 130 coated with the graphene 110 may be used as a transparent electrode film such as a flexible display device, an organic light-emitting device, or a solar cell.

According to an embodiment of the present invention, the graphene 110, in which doping has been completed, is directly transferred onto the target member 130 so that a doping effect of the graphene 110 may be maintained for along time, thereby increasing doping efficiency. Conventionally, an operation (operation S27) of transferring graphene onto a target member and an operation (operation S28) of removing the carrier member are performed after an operation (operation S25) of removing a carrier member is performed. Then, after operation S28 is performed, the graphene formed on the target member is doped by wet coating as described above. Accordingly, the conventional method has a problem that a target substrate is damaged due to a doping solution. However, according to an embodiment of the present invention, since doping is performed when the graphene 110 is formed in the carrier member 120 before the graphene 110 is transferred onto the target member 130, the target member 130 is secure from damage due to the doping solution.

According to a conventional doping method, since a doping material adhered to graphene is exposed to air after doping the graphene, a doping effect of the graphene is decreased and a time to maintain the doped graphene is reduced. Also, according to another conventional doping method, when graphene is synthesized in an operation for synthesizing the graphene, a doping gas, such as ammonia, is exposed to dope the graphene on a catalyst metal. In this case, since a doping material adhered to the graphene is exposed to air until the graphene is transferred onto a target member after doping the graphene, a doping effect is decreased and a time to maintain the doped graphene is reduced. However, according to an embodiment of the present invention, the surface of the graphene 110 to which the doping material 111 is adhered is covered by the target member 130 after the operation for doping the graphene 110 is finished so as not to expose the doping material 111 to air, and thus the method according to an embodiment of the present invention has an excellent effect of maintaining the doped graphene 110.

Next, an operation for removing the carrier member 120 from a ninth stack 900 will be described with reference to FIG. 10 (operation S28).

If the carrier member 120 is a heat-releasable film, heat having a temperature equal to or greater than a releasing temperature is applied to the ninth stack 900 to decrease adhesion of the heat-releasable film, and then a predetermined force is applied to the ninth stack 900 to remove the heat-releasable film from the graphene 110. If the carrier member 120 is a polymer support, an organic solvent, such as acetone, is applied to dissolve the polymer support, thereby removing the polymer support.

Next, referring to FIG. 11, a protection member 140 is formed on the graphene 110 (operation S29). The protection member 140 protects the doped graphene 110 from the outside and maintains a doping effect of the graphene 110. The protection member 140 may be configured as a sheet-, substrate-, or film-type protection member, and a material of the protection member 140 is not particularly limited. The protection member 140 may include, for example, PMMA, a photoresist (PR), an electron resist (ER), SiOx, or AlOx. The protection member 140 may be a kind of release film, and may be removed in a later process if necessary.

Furthermore, It may be analyzed whether the graphene 110 manufactured according to above-described operations is damaged or what kind of electrical characteristic the graphene 110 has. The manufacturing process of the graphene 110 is not limited to the above-described operations, and the order of some operations may be changed, and some operations may be omitted or added.

According to the method of manufacturing the graphene 110, a doping effect of the graphene 110 may be maintained for a long time, compared to a conventional method, and also even large-scaled graphene may be uniformly doped. In addition, the target member 130 is not damaged due to the doping solution.

Experimentally, a nitric acid solution, including 66 wt % of nitric acid and the rest solvents, has an excellent volatility, and thus the nitric acid solution may be vaporized into dopant vapor without using a vaporizer at room temperature. The graphene 110 is exposed to the dopant vapor for about two minutes, and then the doped graphene 110 is directly transferred on the target member 130, thereby forming the protection member 140. Accordingly, the surface resistance of the doped graphene 110 is equal to or less than about 300/sq, which is decreased by about 30% or more to that of the graphene 110 that is not doped.

FIG. 12 is a schematic process view for describing a method of manufacturing a graphene film, according to an embodiment of the present invention. According to an embodiment of the present invention, the operations of the manufacturing process of graphene are performed in one direction according to a roll-to-roll method. Thus, all the stacks in which the catalyst metal 101, the graphene 110, the carrier member 120, the target member 130, the protection member 140, and the above-described components are stacked are roll-type films. The operations of the manufacturing method of the graphene 110 have been described with reference to FIGS. 3 to 11, and thus description regarding a roll-to-roll method will be mainly given below.

First, pretreatment of the catalyst metal 101 is performed. Referring to FIG. 12, the catalyst metal 101 wound around a first wind-off roll 10 is transferred to a graphene film formation space 240 while being unwound.

While the catalyst metal 101 is transferred to the graphene film formation space 240, pretreatment for washing a surface of the catalyst metal 101 is performed. The operation for washing the surface of the catalyst metal 101 may be omitted if necessary, or may be performed before the catalyst metal 101 is wound around the first wind-off roll 10.

Next, an operation for forming a graphene film is performed. Referring to FIG. 12, if the catalyst metal 101 is transferred to the graphene film formation space 240 by using a transfer roller (not shown), carbon atoms separated from a gaseous source of carbon that is supplied in the graphene film formation space 240 are deposited onto the catalyst metal 101 that is heated, and then the catalyst metal 101 is cooled, thereby forming the graphene film. The fourth stack 400, including in the graphene film, is carried out of the graphene film formation space 240 by using the transfer roller.

Next, an operation for forming the carrier member 120 is performed. Here, the carrier member 120 may be a heat-releasable film. Referring to FIG. 12, the carrier member 120 wound around a second wind-off roll 20 is transferred to a first attaching roller 11 while being unwound, and the fourth stack 400 transferred from the graphene film formation space 240 is transferred to a second attaching roller 12, thereby forming the fifth stack 500 in which the carrier member 120 is formed on one surface of the fourth stack 400. The first and second attaching rollers 11 and 12 are disposed to be spaced apart from each other by a predetermined interval of a transfer path of the fourth stack 400. The first and second attaching rollers 11 and 12 press the carrier member 120 that is wound off from the second wind-off roll 20 and the fourth stack 400 to attach the carrier member 120 and the fourth stack 400 to each other.

Next, an operation for removing the graphene film exposed in the fifth stack 500 is performed. Referring to FIG. 12, the fifth stack 500 is transferred to a graphene film removing space 260 via the transfer roller according to a roll-to-roll method. The graphene film may be removed in the graphene film removing space 260 by dry etching or wet etching. The sixth stack 600, in which the graphene film formed on one surface of the catalyst metal 101 is removed in the graphene film removing space 260, is carried to the outside by using the transfer roller. The operation for removing the graphene film may be performed before the operation for attaching the carrier member 120.

Next, an operation for removing the catalyst metal 101 is performed. Referring to FIG. 12, the sixth stack 600 is transferred to a wet etching space 271 according to a roll-to-roll method by using the transfer roller. Although FIG. 12 shows that a catalyst metal removing solution is stored in a water tank in the wet etching space 271, the present invention is not limited thereto. The wet etching space 271 may be configured as any of various apparatuses, for example, an apparatus including a sprayer for spraying the catalyst metal removing solution.

Next, the operations for washing and drying the seventh stack 700 are performed. Referring to FIG. 12, the seventh stack 700, on which the wet etching is completed, is transferred to a washing and drying space 272 according to a roll-to-roll method and is then washed and dried.

Next, the operation for doping the graphene film is performed. Referring to FIG. 12, the seventh stack 700 is transferred to a doping space 280, which is sealed, via the transfer roller according to a roll-to-roll method. The doping space 280 is sealed to prevent external air from entering, and thus prevents foreign substances other than the dopant vapor from being adhered to the graphene 110. In order to effectively vaporize the doping solution, the doping space 280 may be in a vacuum state. The doping process according to an embodiment of the present invention is performed by using dopant vapor. Although FIG. 12 shows that a water tank 281 filled with the doping solution is disposed inside the doping space 280, the present invention is not limited thereto.

The doping space 280 may further include a vaporizer (not shown). Also, the doping space 280 may include a cooler 282 for liquefying some of the vaporized doping solution. The cooler 282 may be disposed at a ceiling or at a side surface of the doping space 280. The doping solution may be volatile, and the types of the doping solution have been described above in detail, and thus a repeated description thereof is omitted. An eighth stack 800 to which a doping material is adhered in the doping space 280 is carried to the outside by using the transfer roller.

Next, the operation for forming the target member 130 is performed. Referring to FIG. 12, the target member 130 wound around a third wind-off roll 30 is transferred to a third attaching roller 13 while being unwound, and the graphene film of the eighth stack 800, which is carried out from the doping space 280 in one direction according to a roll-to-roll method, is transferred to the target member 130 via the third attaching roller 13 and a fourth attaching roller 14 that are disposed to face each other, thereby forming the ninth stack 900.

Next, the operation for removing the carrier member 120 is performed. Referring to FIG. 12, the ninth stack 900 is transferred to a carrier member removing space 310 by using the transfer roller. The carrier member removing space 310 applies heat having a temperature equal to or greater than a release temperature to the ninth stack 900 so as to separate the carrier member 120 from the graphene film. The separated carrier member 120 is wound around a fourth wind-off roll 40. A tenth stack 1000 from which the carrier member 120 is separated in the carrier member removing space 310 is carried to the outside by using the transfer roller.

Next, the operation for forming the protection member 140 is performed. Referring to FIG. 12, the protection member 140 wound around a fifth wind-off roll 50 is transferred toward a fifth attaching roller 15 while being unwound, and the tenth stack 1000 is transferred toward a sixth attaching roller 16, thereby forming the protection member 140 on one surface of the tenth stack 1000. The fifth and sixth attaching rollers 15 and 16 are disposed to be spaced apart from each other by a predetermined interval of a transfer path of the tenth stack 1000. The fifth and sixth attaching rollers 15 and 16 press the protection member 140, which is wound off from the fifth wind-off roll 50, and the tenth stack 1000 to attach the protection member 140 and the tenth stack 1000 to each other, thereby forming an eleventh stack 1100.

As described above, according to the method of manufacturing a graphene film of the present invention, all the operations are performed according to a roll-to-roll method, and thus the graphene film may be manufactured in large quantities. Also, a doping process may be performed according to a roll-to-roll method in which the seventh stack passes through a doping space at a predetermined speed, and thus the graphene film may be uniformly doped. The target member and the protection member may be directly formed on the doped graphene film according to a roll-to-roll method, and thus a doping effect may be effectively maintained for a long time.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

According to an embodiment of the present invention, a method of manufacturing graphene with an improved electrical characteristic is provided. Thus, large-scaled graphene may be commercialized, and the embodiments of the present invention may be applied to a transparent electrode and an active layer that include graphene. Also, the embodiments of the present invention may be used in a display device, an electronic device, a photoelectric device, a battery, a solar cell, etc. that include the transparent electrode and the active layer.

The invention claimed is:

1. A method of manufacturing graphene, the method comprising the following steps in order:
preparing a carrier member on which the graphene is formed on one surface thereof;
exposing a first surface of the graphene to dopant vapor to dope the graphene;
transferring the doped graphene onto a target member so that the first surface of the graphene faces the target member; and
removing the carrier member.

2. The method of claim 1, wherein the preparing of the carrier member on which the graphene is formed on one surface thereof comprises:
forming the graphene on two surfaces of a catalyst metal;
forming the carrier member on the graphene that is formed on one surface of the catalyst metal; and
removing the catalyst metal.

3. The method of claim 2, further comprising removing the graphene formed on an other surface of the catalyst metal before the removing of the catalyst metal.

4. The method of claim 2, wherein the catalyst metal comprises at least one selected from the group consisting of nickel (Ni) and copper (Cu).

5. The method of claim 2, wherein the catalyst metal is removed by wet etching.

6. The method of claim 1, further comprising forming a protection member on the exposed graphene after the removing of the carrier member.

7. The method of claim 1, wherein the carrier member is a heat-releasable film.

8. The method of claim 1, wherein the target member is formed of a material that is formed according to a roll-to-roll method, and the target member comprises at least one selected from the group consisting of polyethylene terephthalate (PET), polyimide (PI), polycarbonate, and polymethyl methacrylate (PMMA).

9. The method of claim 1, wherein the dopant vapor is composed of a volatile doping solution that is vaporized.

10. The method of claim 9, wherein the doping solution comprises at least one selected from the group consisting of gold(III) chloride (AuCl3), nitric acid (HNO3), and hydrochloric acid (HCl).

11. The method of claim 1, wherein the doping of the graphene is performed in a sealed space.

12. A method of manufacturing a graphene film, the method comprising the following steps in order:
preparing a roll-type heat-releasable film in which the graphene film is formed on one surface thereof;
exposing a first surface of the graphene film to dopant vapor to dope the graphene film;
transferring the doped graphene film onto a roll-type target film so that the first surface of the graphene faces the roll-type target film; and
removing the heat-releasable film,
wherein the steps are performed in one direction according to a roll-to-roll method.

13. The method of claim 12, wherein the preparing of the heat-releasable film in which the graphene film is formed on one surface thereof comprises:
forming the graphene film on two surfaces of a roll-type catalyst metal film;
forming the heat-releasable film on the graphene film that is formed on one surface of the catalyst metal film;
removing the graphene film formed on an other surface of the catalyst metal film; and
removing the catalyst metal film,
wherein the steps are performed in one direction according to a roll-to-roll method.

14. The method of claim 12, further comprising forming a roll-type protection film on the exposed graphene film after the removing of the heat-releasable film, wherein the forming of the roll-type protection film is performed in one direction according to a roll-to-roll method.

15. The method of claim 12, wherein the dopant vapor is composed of a volatile doping solution that is vaporized by using a vaporizer.

16. The method of claim 15, wherein the doping solution comprises at least one selected from the group consisting of gold(III) chloride (AuCl3) nitric acid (HNO3), and hydrochloric acid (HCl).

17. The method of claim 15, wherein in the dopant vapor, some dopant vapor that is not doped on the graphene film is liquefied by using a cooler to thus become the doping solution.

18. The method of claim 15, wherein the doping of the graphene film is performed in a sealed space.

* * * * *